(12) United States Patent
Saitoh et al.

(10) Patent No.: US 9,793,134 B2
(45) Date of Patent: *Oct. 17, 2017

(54) ETCHING METHOD

(71) Applicant: Tokyo Electron Limited, Tokyo (JP)

(72) Inventors: Yusuke Saitoh, Miyagi (JP); Hironobu Ichikawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/080,666

(22) Filed: Mar. 25, 2016

(65) Prior Publication Data

US 2016/0293439 A1 Oct. 6, 2016

(30) Foreign Application Priority Data

Mar. 31, 2015 (JP) .................. 2015-071502

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |
| *H01L 21/302* | (2006.01) |
| *H01L 21/461* | (2006.01) |
| *H01L 21/311* | (2006.01) |
| *H01L 21/3065* | (2006.01) |

(Continued)

(52) U.S. Cl.
CPC .... *H01L 21/31116* (2013.01); *H01L 21/0332* (2013.01); *H01L 21/3065* (2013.01); *H01L 21/3085* (2013.01); *H01L 21/31144* (2013.01); *H01L 27/1157* (2013.01); *H01L 27/11573* (2013.01); *H01L 27/11575* (2013.01); *H01L 27/11582* (2013.01)

(58) Field of Classification Search
None
See application file for complete search history.

(56) References Cited

U.S. PATENT DOCUMENTS 5,830,807 A * 11/1998 Matsunaga ......... H01L 21/3065
  216/68
2013/0043455 A1* 2/2013 Bateman ............. H01L 27/2454
  257/5

(Continued)

FOREIGN PATENT DOCUMENTS

WO    2013118660    * 8/2013

*Primary Examiner* — Stephanie Duclair
(74) *Attorney, Agent, or Firm* — Pearne & Gordon LLP

(57) ABSTRACT

A method of concurrently etching a first region in which silicon oxide films and silicon nitride films are alternately stacked and a second region including the silicon oxide film having a thickness larger than a thickness of the silicon oxide film of the first region is provided. The method includes generating plasma of a first processing gas containing a fluorocarbon gas and a hydrofluorocarbon gas within a processing vessel of a plasma processing apparatus into which a processing target object is carried; and generating plasma of a second processing gas containing a hydrogen gas, a hydrofluorocarbon gas and a nitrogen gas within the processing vessel of the plasma processing apparatus. Further, the generating of the plasma of the first processing gas and the generating of the plasma of the second processing gas are repeated alternately.

8 Claims, 6 Drawing Sheets

(51) Int. Cl.
*H01L 21/308* (2006.01)
*H01L 21/033* (2006.01)
*H01L 27/1157* (2017.01)
*H01L 27/11573* (2017.01)
*H01L 27/11575* (2017.01)
*H01L 27/11582* (2017.01)

(56) References Cited

U.S. PATENT DOCUMENTS

2013/0059450 A1    3/2013  Le Gouil et al.
2013/0256777 A1\*  10/2013  Khoueir ............. H01L 29/7889
                                                                   257/316
2015/0011094 A1\*  1/2015  Narishige ......... H01L 27/11556
                                                                   438/723

\* cited by examiner

ETCHING METHOD

CROSS-REFERENCE TO RELATED APPLICATION

This application claims the benefit of Japanese Patent Application No. 2015-071502 filed on Mar. 31, 2015, the entire disclosures of which are incorporated herein by reference.

TECHNICAL FIELD

The embodiments described herein pertain generally to an etching method; and, more particularly, to a method of concurrently etching a first region including a multilayered film in which silicon oxide films and silicon nitride films are alternately stacked and a second region including a silicon oxide film having a thickness larger than a thickness of the silicon oxide film of the first region.

BACKGROUND

As one kind of semiconductor devices, a NAND type flash memory device having a three-dimensional structure is known in the art. In the manufacture of the NAND type flash memory device having the three-dimensional structure, there is performed a process of forming a deep hole in a multilayered film, in which silicon oxide films and silicon nitride films are alternately stacked on top of each other, by etching the multilayered film. This etching process is described in Patent Document 1.

To be specific, in Patent Document 1, there is disclosed a method of etching a multilayered film by exposing a processing target object having a mask on the multilayered film to plasma of a processing gas.

Patent Document 1: U.S. Patent Application Publication No. 2013/0059450

A processing target object to be etched may include a first region including a multilayered film in which silicon oxide films and silicon nitride films are alternately stacked on top of each other; and a second region including a silicon oxide film having a thickness larger than a thickness of the silicon oxide film of the first region. It is required to form a space such as a hole and/or a trench in the first region and in the second region at the same time by etching the processing target object.

To etch the first region and the second region concurrently, a mask is provided on the first region and the second region, and portions of the first region and the second region exposed through openings of the mask are etched. In this etching process, plasma of a processing gas containing a fluorocarbon gas and a hydrofluorocarbon gas may be generated within a processing vessel of a plasma processing apparatus.

In the etching with the plasma of the processing gas, however, the width of a space formed in the second region may be enlarged at a portion thereof in a depth direction. That is, verticality of a sidewall surface surrounding the space formed by the etching of the second region may be deteriorated.

In this regard, in the technique of concurrently etching the first region including the multilayered film in which the silicon oxide films and the silicon nitride films are alternately stacked and the second region including the silicon oxide film having the thickness larger than the thickness of the silicon oxide film of the first region, it is required to improve the verticality of the sidewall surface formed by the etching.

SUMMARY

In one exemplary embodiment, there is provided a method of etching a first region and a second region of a processing target object at the same time. The first region includes a multilayered film in which silicon oxide films and silicon nitride films are alternately stacked on top of each other, and the second region includes a silicon oxide film having a thickness larger than a thickness of the silicon oxide film of the first region. Further, the processing target object has a mask provided with openings on the first region and the second region. Here, the method includes generating plasma of a first processing gas containing a fluorocarbon gas and a hydrofluorocarbon gas within a processing vessel of a plasma processing apparatus into which the processing target object is carried; and generating plasma of a second processing gas containing a hydrogen gas, a hydrofluorocarbon gas and a nitrogen gas within the processing vessel of the plasma processing apparatus. Further, the generating of the plasma of the first processing gas and the generating of the plasma of the second processing gas are repeated alternately.

Through the generating the plasma of the first processing gas, both the first region and the second region are etched. In the generating the plasma of the second processing gas, fluorine generated by dissociation of a hydrofluorocarbon gas combines with hydrogen, so that the amount of the hydrogen is reduced. Furthermore, carbon and/or hydrocarbon generated by the dissociation of the hydrofluorocarbon gas adhere to a sidewall surrounding a space formed by the etching. Accordingly, the sidewall surface formed by the etching is protected. Moreover, the amount of the carbon and/or the hydrocarbon deposited on the mask is decreased by active species of nitrogen. Therefore, according to the present exemplary embodiment, it is possible to suppress openings of the mask from being clogged, and verticality of the sidewall surface formed by the etching, particularly, the sidewall surface of the second region, which is formed by the etching, can be improved.

A processing time period of the generating of the plasma of the first processing gas may be longer than a processing time period of the generating of the plasma of the second processing gas. The generating the plasma of the second processing gas is mainly performed to protect the sidewall surface, and the contribution level thereof to the etching is comparatively low. According to the present exemplary embodiment, since a processing time period of contributing to the protection of the sidewall surface is set to be shorter than a processing time period of contributing to the etching, the throughput of etching the first region and the second region can be increased.

The second processing gas may further contain a nitrogen trifluoride gas. The nitrogen trifluoride gas may contribute to adjusting an etching amount of the mask and a hydrocarbon amount. The second processing gas may further contain a carbonyl sulfide gas. A sulfur (S)-containing reaction product generated by dissociation of the carbonyl sulfide gas may contribute to protection of the mask and adjustment of an opening width of the mask. The second processing gas may further contain a boron trichloride gas. The boron trichloride gas may contribute to formation of a reaction product for the protection of the sidewall surface formed by the etching. The second processing gas may further contain a hydrocarbon gas. The hydrocarbon gas may serve as a hydrocarbon source for the protection of the sidewall surface. The mask may be made of carbon, for example, amorphous carbon.

According to the exemplary embodiments as described above, in the technique of etching the first region including the multilayered film in which the silicon oxide films and the silicon nitride films are alternately stacked and the second region including the silicon oxide film having a thickness larger than the thickness of the silicon oxide film of the first region, the verticality of the sidewall surface formed by the etching can be improved.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
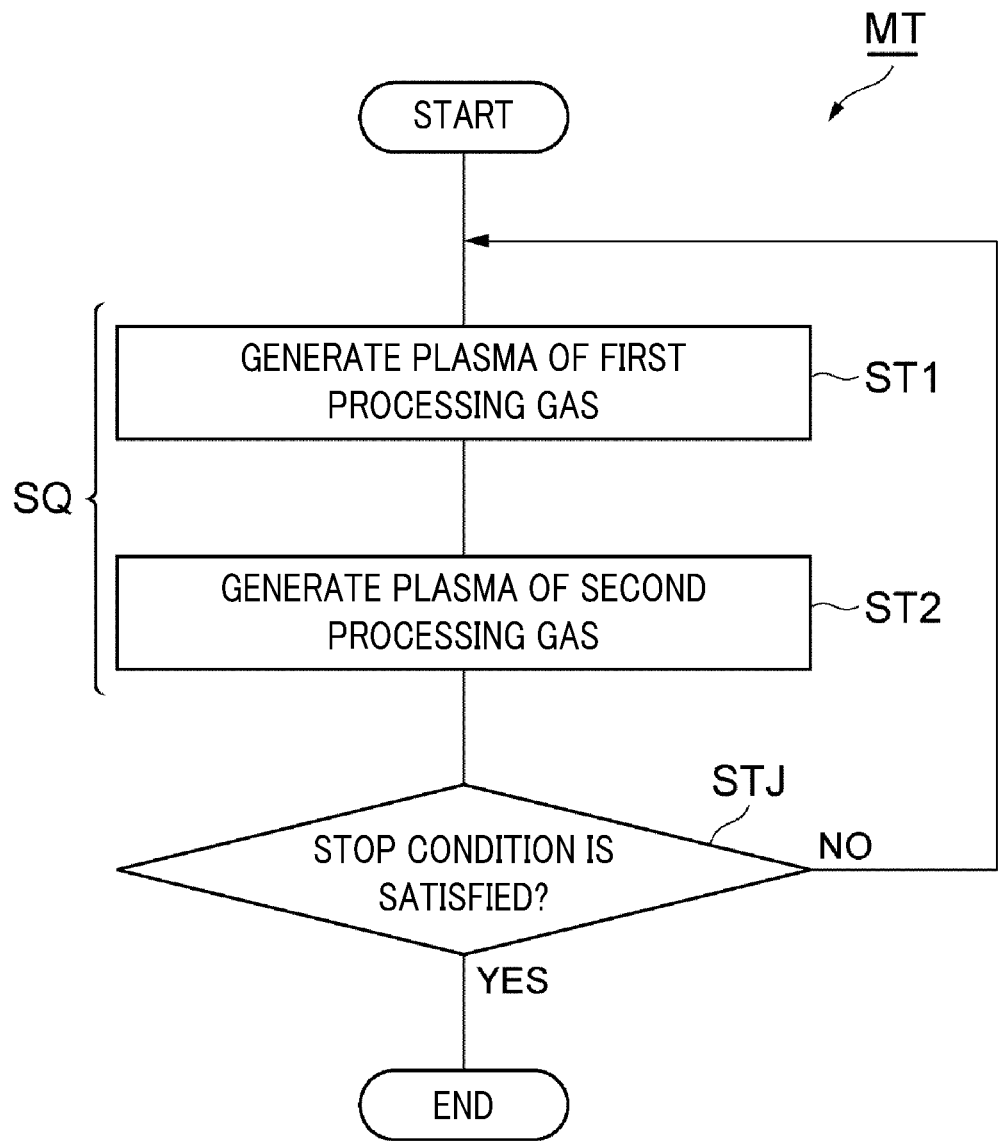
FIG. 1 is a flowchart for describing an etching method according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

FIG. 1 is a flowchart for describing an etching method according to an exemplary embodiment. The method MT shown in FIG. 1 is directed to forming a space such as a hole or a trench by etching both a first region and a second region. This method MT is applicable to the manufacture of, for example, a NAND type flash memory having a three-dimensional structure.

Figure 2:
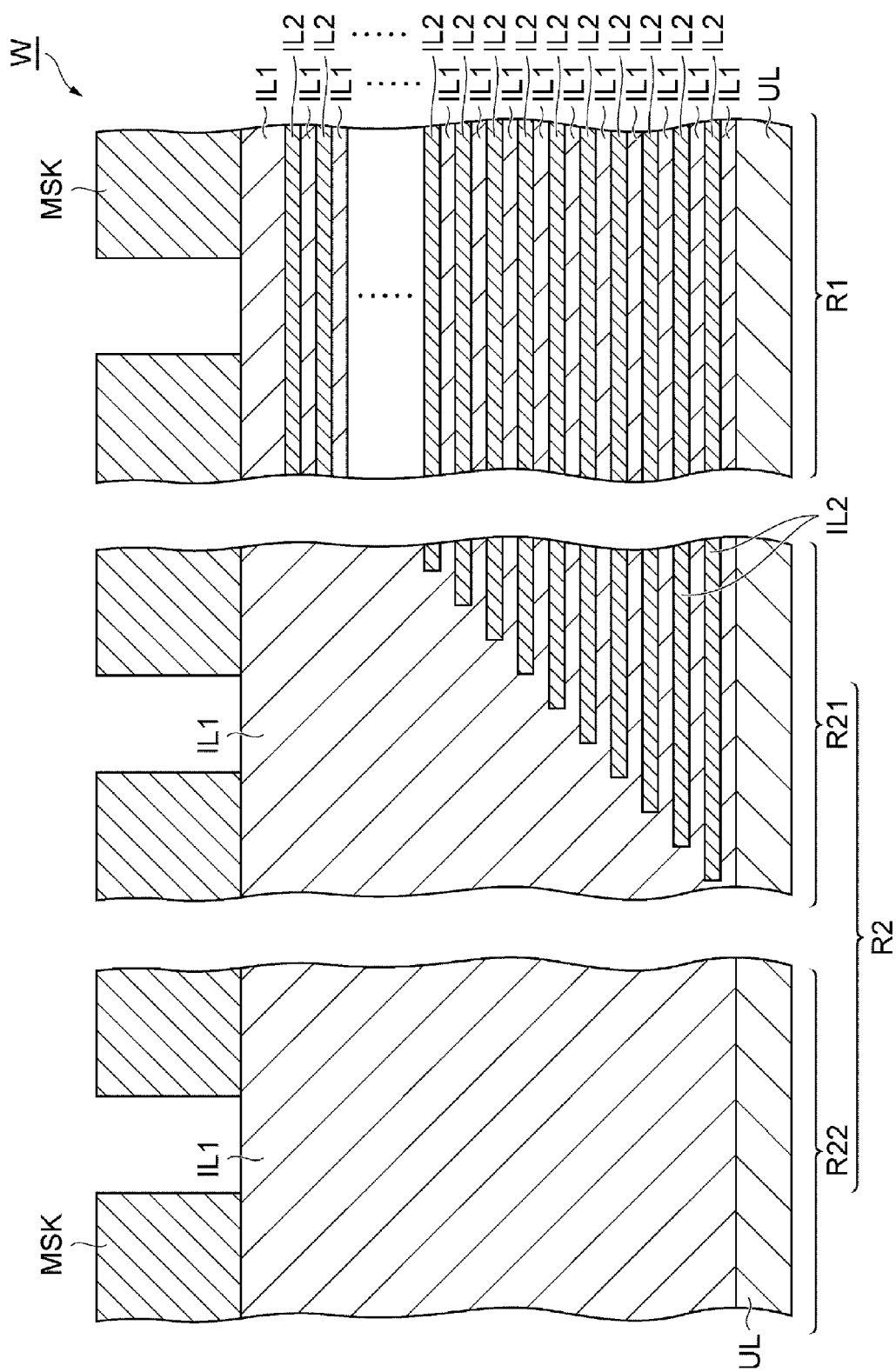
FIG. 2 is a cross sectional view illustrating an example of a processing target object on which the etching method of FIG. 1 is performed.

FIG. 2 is a cross sectional view illustrating an example of a processing target object on which the etching method of FIG. 1 is performed. The processing target object (hereinafter, referred to as "wafer W") shown in FIG. 2 has a base layer UL, a first region R1, a second region R2 and a mask MSK. The base layer UL may be, by way of example, but not limitation, a polycrystalline silicon layer provided on a substrate. The first region R1 and the second region R2 are provided on the base layer UL.

The first region R1 is formed of a multilayered film. The multilayered film is composed of silicon oxide films IL1 and silicon nitride films IL2 alternately stacked on top of each other. In the first region R1, a thickness of the silicon oxide film IL1 is in the range from, e.g., 5 nm to 50 nm, and a thickness of the silicon nitride film IL2 is in the range from, e.g., 10 nm to 75 nm. According to the exemplary embodiment, in the first region R1, the silicon oxide films IL1 and the silicon nitride films IL2 are stacked in twenty-four or more layers in total.

The second region R2 includes a silicon oxide film having a thickness larger than the thickness of the silicon oxide film IL1 of the first region R1. In the exemplary embodiment, the second region R2 includes a sub-region R21 and a sub-region R22. Some of the silicon nitrides films IL2 of the first region R1 are extended into the sub-region R21 in a direction orthogonal to the stacking direction of the multilayered film. As depicted in FIG. 2, the silicon nitride films IL2 extended into the sub-region R21 from the first region R1 are ended in the sub-region R21 to form a step shape. A portion of the sub-region R21 except the silicon nitride films IL2 is formed of the silicon oxide film IL1. The sub-region R22 is formed of a monolayer of the silicon oxide film IL1. A thickness of the second region R2 having the above-described structure is substantially equal to that of the first region R1.

The mask MSK is provided on the first region R1 and the second region R2. The mask MSK is provided with openings for forming spaces such as holes or trenches in the first region R1 and the second region R2. The mask MSK may be made of, by way of example, but not limitation, amorphous carbon. Alternatively, the mask MSK may be made of, for example, organic polymer.

Figure 3:
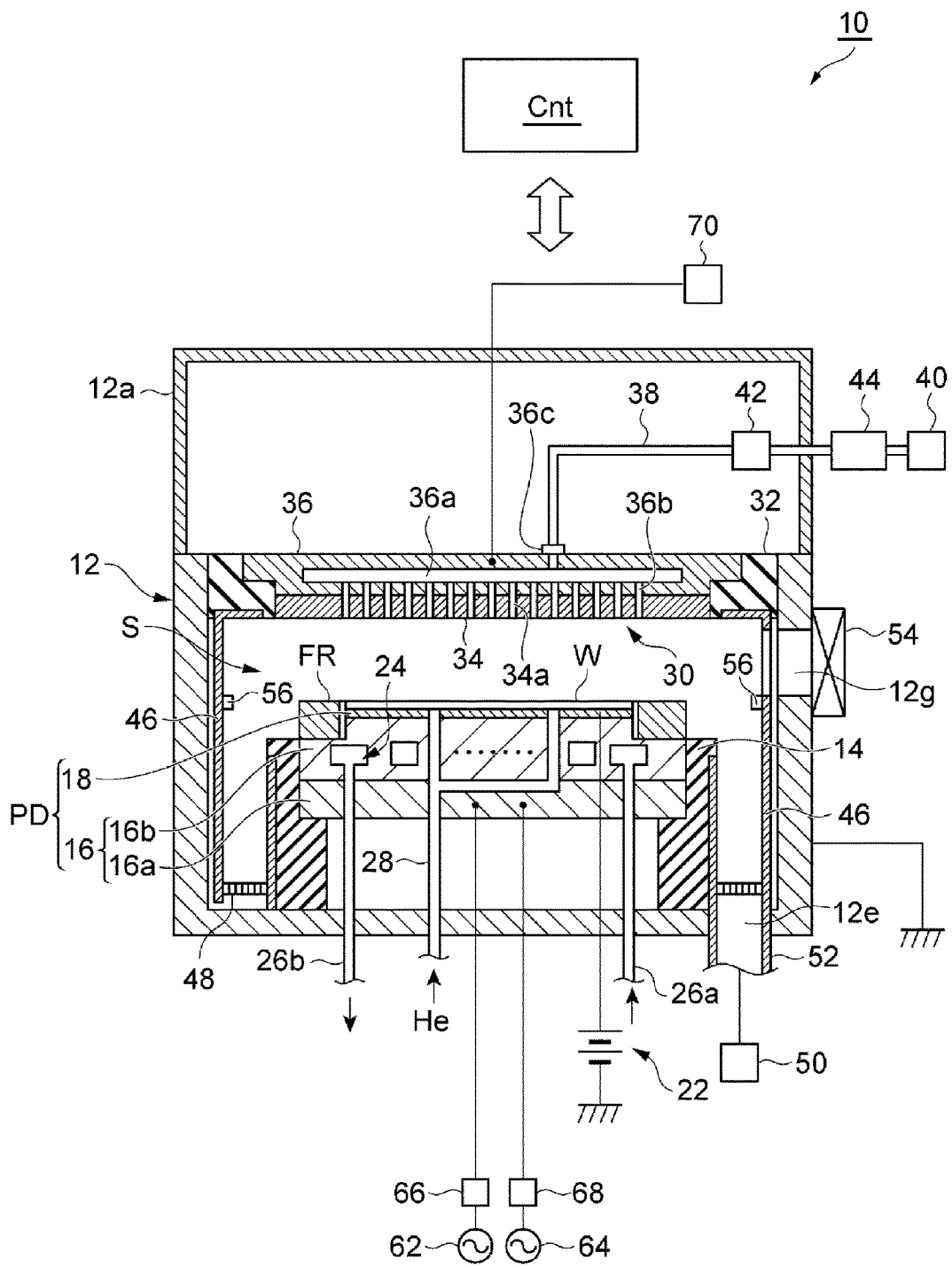
FIG. 3 is a diagram schematically illustrating an example of a plasma processing apparatus in which the etching method of FIG. 1 is performed.

In the method MT, the wafer W as shown in FIG. 2 is carried in a processing vessel of a plasma processing apparatus. FIG. 3 is a diagram schematically illustrating an example of the plasma processing apparatus in which the method shown in FIG. 1 is performed.

The plasma processing apparatus 10 shown in FIG. 3 is configured as a capacitively coupled plasma etching apparatus and includes a substantially cylindrical processing vessel 12. An inner wall surface of the processing vessel 12 is formed of anodically oxidized aluminum. This processing vessel 12 is frame-grounded. A passage 12g through which the wafer W is carried into/out of the processing vessel 12 is formed at a sidewall of the processing vessel 12. The passage 12g is opened or closed by a gate valve 54.

A substantially cylindrical supporting member 14 made of an insulating material is provided on a bottom portion of the processing vessel 12. Within the processing vessel 12, the supporting member 14 is vertically extended from the bottom portion of the processing vessel 12. The supporting member 14 supports thereon a mounting table PD within the processing vessel 12.

The mounting table PD includes a lower electrode 16 and an electrostatic chuck 18. In the exemplary embodiment, the lower electrode 16 includes a first member 16a and a second member 16b. Each of the first member 16a and the second member 16b has a substantially disk shape and is made of a conductor such as aluminum. The second member 16b is provided on the first member 16a and is electrically connected to the first member 16a.

The first member 16a is connected to a first high frequency power supply 62 via a matching device 66. The first high frequency power supply 62 is configured to generate a high frequency power (high frequency wave) for plasma generation. Specifically, the first high frequency power supply 62 generates a high frequency power having a frequency ranging from 27 MHz to 100 MHz, for example, 40 MHz. The matching device 66 includes a circuit for matching an output impedance of the first high frequency power supply 62 and an input impedance at a load side (the lower electrode 16). The first high frequency power supply 62 may be connected to an upper electrode 30 via the matching device 66.

Further, the first member 16a is also connected to the second high frequency power supply 64 via a matching device 68. The second high frequency power supply 64 is configured to generate a high frequency power for attracting ions into the wafer W, i.e., a high frequency bias power. Specifically, the second high frequency power supply 64 generates a high frequency bias power having a frequency in the range from 400 kHz to 13.56 MHz, e.g., 3 MHz. The matching device 68 includes a circuit for matching an output impedance of the second high frequency power supply 64 and an input impedance at the load side (the lower electrode 16).

A coolant path 24 is provided within the second member 16b. A coolant is supplied into the coolant path 24 from a chiller unit provided outside the processing vessel 12 via a pipeline 26a, and the coolant supplied into the coolant path 24 is returned back into the chiller unit via a pipeline 26b. By controlling the temperature of the coolant being circulated as described, a temperature of the wafer W held on the electrostatic chuck 18 can be controlled.

The electrostatic chuck 18 is provided on the second member 16b. The electrostatic chuck 18 includes a film-shaped electrode embedded between a pair of insulating layers or insulating sheets. The electrostatic chuck 18 is electrically connected to a DC power supply 22 via a switch. The electrostatic chuck 18 is configured to attract and hold the wafer W by an electrostatic force such as a Coulomb force generated by a DC voltage applied from the DC power supply 22. A heating device such as a heater may be provided within the electrostatic chuck 18.

A focus ring FR is provided on the second member 16b to surround the electrostatic chuck 18. The focus ring FR is provided to improve etching uniformity. By way of non-limiting example, the focus ring FR is made of quartz.

Further, a gas supply line 28 is provided through the lower electrode 16 and the electrostatic chuck 18. The gas supply line 28 is configured to supply a heat transfer gas from a heat transfer gas supply device, for example, a He gas, into a gap between a top surface of the electrostatic chuck 18b and a rear surface of the wafer W.

Further, the plasma processing apparatus 10 further includes the upper electrode 30. The upper electrode 30 is provided above the mounting table PD, facing the mounting table PD. The lower electrode 16 and the upper electrode 30 are arranged to be substantially parallel to each other. Formed between the mounting table PD and the upper electrode 30 is a processing space S in which a plasma process is performed on the wafer W.

The upper electrode 30 is supported at an upper portion of the processing vessel 12 with an insulating shield member 32 therebetween. The upper electrode 30 may include an electrode plate 34 and an electrode supporting body 36. The electrode plate 34 faces the processing space S and is provided with a multiple number of gas discharge holes 34a. The electrode plate 34 may be made of a conductor or a semiconductor having low resistance and low Joule heat.

The electrode supporting body 36 is configured to support the electrode plate 34 in a detachable manner, and is made of a conductive material such as, but not limited to, aluminum. The electrode supporting body 36 may have a water-cooling structure. A gas diffusion space 36a is formed within the electrode supporting body 36. A multiple number of gas through holes 36b is extended downwards from the gas diffusion space 36a, and these gas through holes 36b respectively communicate with the gas discharge holes 34a. Further, the electrode supporting body 36 is also provided with a gas inlet opening 36c through which a processing gas is introduced into the gas diffusion space 36a, and this gas inlet opening 36c is connected to a gas supply line 38.

The gas supply line 38 is connected to a gas source group 40 via a valve group 42 and a flow rate controller group 44. The gas source group 40 includes a plurality of gas sources. The gases sources may include a source of a fluorocarbon gas, a source of a hydrofluorocarbon gas, a source of a hydrogen gas ($H_2$ gas), and a source of a nitrogen gas ($N_2$ gas). Further, in the exemplary embodiment, the gas sources may further include a source of an oxygen gas ($O_2$ gas), a source of a nitrogen trifluoride gas ($NF_3$ gas), a source of a carbonyl sulfide gas (COS gas), a source of a boron trichloride gas ($BCl_3$ gas), and a source of a hydrocarbon gas. As a fluorocarbon gas, one or more fluorocarbon gases such as, but not limited to, a $C_4F_6$ gas, a $C_4F_8$ and a $CF_4$ gas may be used. The hydrofluorocarbon gas may be, but not limited to, a $CH_2F_2$ gas. Further, the hydrocarbon gas may be, but not limited to, a $CH_4$ gas. Further, the gas sources may further include a source of a rare gas such as a He gas, a Ne gas, an Ar gas, a Kr gas, or the like.

The valve group 42 includes multiple valves, and the flow rate controller group 44 includes multiple flow rate controllers such as mass flow controllers (MFC). Each of the gas sources belonging to the gas source group 40 is connected to the gas supply line 38 via each corresponding flow rate controller belonging to the flow rate controller group 44 and each corresponding valve belonging to the valve group 42. In the plasma processing apparatus 10, a gas from a gas source selected from the gas sources belonging to the gas source group 40 is introduced into the gas diffusion chamber 36a through the gas supply line 38, and then, is discharged into the processing space S through the gas through holes 36b and the gas discharge holes 34a.

Further, the plasma processing apparatus 10 further includes a DC power supply unit 70. The DC power supply unit 70 is connected to the upper electrode 30. The DC power supply 70 is configured to generate a negative DC voltage and is capable of applying the DC voltage to the upper electrode 30.

Further, the plasma processing apparatus 10 may further include a grounding conductor 12a. The grounding conductor 12a has a substantially cylindrical shape, and is extended upwards from a sidewall of the processing vessel 12 up to a position higher than the upper electrode 30.

Further, in the plasma processing apparatus 10, a deposition shield 46 is provided along an inner wall of the processing vessel 12 in a detachable manner. The deposition shield 46 is also provided on an outer side surface of the supporting member 14. The deposition shield 46 is configured to suppress an etching byproduct (deposit) from adhering to the processing vessel 12, and is formed by coating an aluminum member with ceramics such as $Y_2O_3$.

At the bottom portion of the processing vessel 12, a gas exhaust plate 48 is provided between the supporting member 14 and the inner wall of the processing vessel 12. The gas exhaust plate 48 may be made of, by way of example, an aluminum member coated with ceramic such as $Y_2O_3$. The gas exhaust plate 48 is provided with a multiple number of through holes. The processing vessel 12 is also provided with a gas exhaust opening 12e under the gas exhaust plate 48, and the gas exhaust opening 12e is connected with a gas exhaust device 50 via a gas exhaust line 52. The gas exhaust device 50 includes a pressure control valve and a vacuum pump such as a turbo molecular pump, and is capable of decompressing the inside of the processing vessel 12 to a required pressure level.

Furthermore, a conductive member (GND block 56 is provided at the inner wall of the processing vessel 12. The conductive member 56 is mounted to the inner wall of the processing vessel 12 such that it is located at a position substantially same level as the wafer W in a height direction. The conductive member 56 is DC-connected to the ground, and has an effect of suppressing an abnormal discharge. Further, the mounting location of the conductive member 56 may not be limited to the position shown in FIG. 3 as long as it is provided within a plasma generation region.

In addition, the plasma processing apparatus 10 may further include a control unit Cnt. The control unit Cnt may be a computer including a processor, a storage unit, an input device, a display device, and the like, and is configured to control individual components of the plasma processing apparatus 10. Through the control unit Cnt, an operator can input commands to manage the plasma processing apparatus 10 by using the input device, and an operational status of the plasma processing apparatus 10 can be visually displayed on the display device. Further, in the storage unit of the control unit Cnt, a control program for controlling various processes performed in the plasma processing apparatus 10 by the processor, or a program for allowing each component of the plasma processing apparatus 10 to perform a process according to processing conditions, i.e., a process recipe is stored. In the exemplary embodiment, the control unit Cnt controls the individual components of the plasma processing apparatus 10 according to the process recipe to perform the method MT.

In the plasma processing apparatus 10 having the above-described configuration, a processing gas from the gas source selected from the gas sources belonging to the gas source group 40 is supplied into the processing space S, and a pressure within the processing space S is set to a preset pressure by the gas exhaust device 50. Further, the high frequency power from the first high frequency power supply 62 is applied to the lower electrode 16, and the high frequency bias power from the second high frequency power supply 64 is applied to the lower electrode 16. As a result, the processing gas is excited into plasma in the processing space S, and a plasma process such as an etching process is performed on the wafer W by active species such as ions in the plasma.

Figure 4:
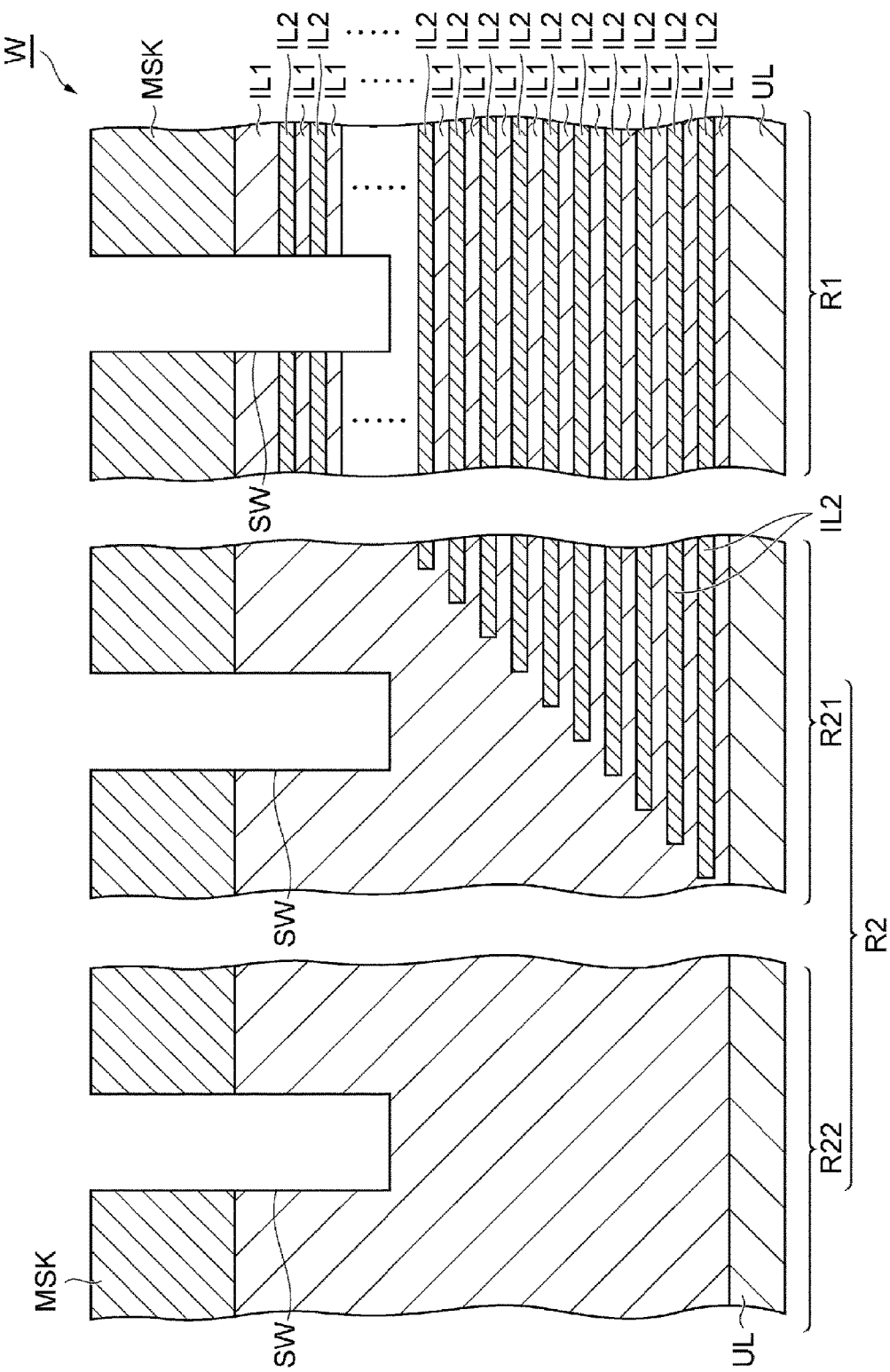
FIG. 4 is a cross sectional view illustrating an example state of the processing target object in the middle of performing the etching method of FIG. 1.
Figure 5:
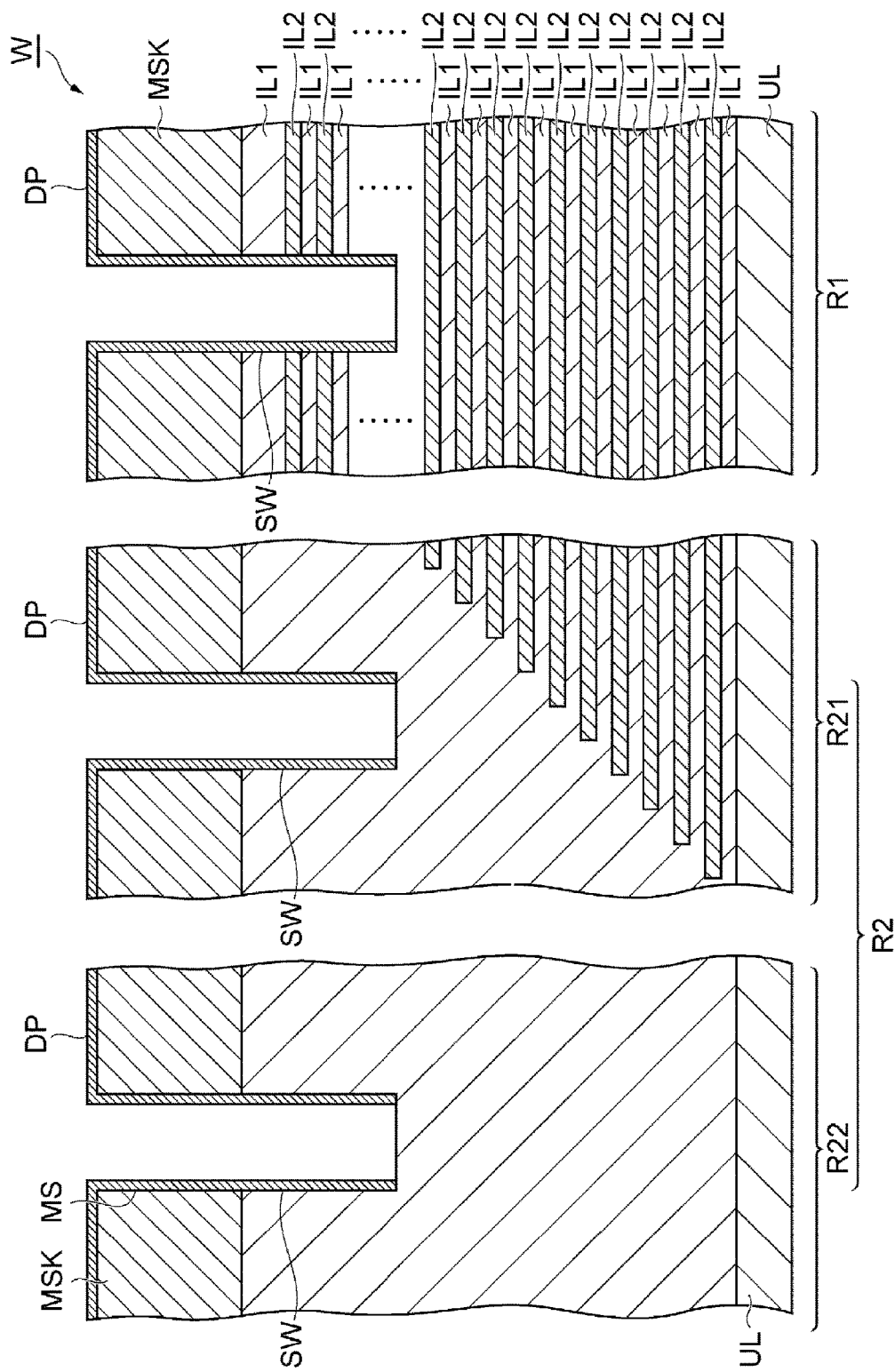
FIG. 5 is a cross sectional view illustrating an example state of the processing target object in the middle of performing the etching method of FIG. 1.
Figure 6:
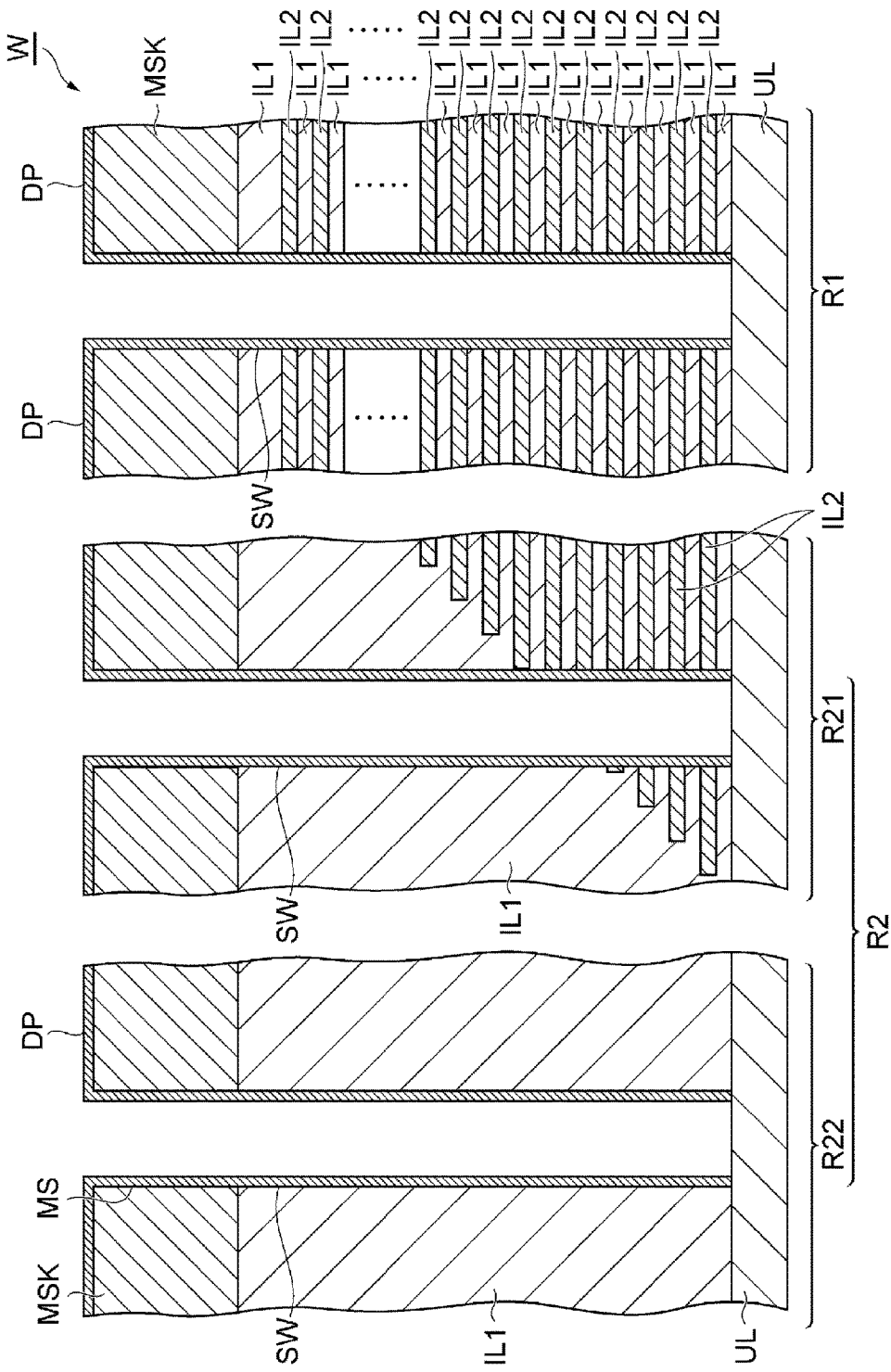
FIG. 6 is a cross sectional view illustrating an example state of the processing target object after performing the etching method of FIG. 1.

Referring back to FIG. 1, the method MT will be further explained. Below, reference is made to FIG. 4 to FIG. 6 as well as FIG. 1. FIG. 4 and FIG. 5 are cross sectional views illustrating an example state of the processing target object in the middle of performing the method depicted in FIG. 1. Further, FIG. 6 is a cross sectional view illustrating an example state of the processing target object after performing the method depicted in FIG. 1. In the following description, the method MT will be elaborated for an example case where the plasma processing apparatus 10 is used to perform the method MT.

In the method MT, as described above, the wafer W is carried into the processing vessel 12 of the plasma processing apparatus 10. The wafer W is mounted on the mounting table PD and is held thereon by the electrostatic chuck 18. In the method MT, a process ST1 and a process ST2 are alternately repeated.

In the process ST1, plasma of a first processing gas is generated within the processing vessel 12. The first processing gas contains a fluorocarbon gas and a hydrofluorocarbon gas. As one example, the first processing gas may contain one or more fluorocarbon gases such as, but not limited to, a $C_4F_6$ gas, a $C_4F_8$ gas and a $CF_4$ gas. Further, the first processing gas may contain a $CH_2F_2$ gas as the hydrofluorocarbon gas. Furthermore, the first processing gas may further contain an oxygen gas ($O_2$ gas) as well, in addition to the fluorocarbon gas and the hydrofluorocarbon gas.

In the process ST1, the first processing gas is supplied into the processing vessel 12, and a pressure within the processing space S is set to a preset pressure by the gas exhaust device 50. Further, in the process ST1, a high frequency power from the first high frequency power supply 62 and a high frequency bias power from the second high frequency power supply 64 are applied to the lower electrode 16.

In the process ST1, the first processing gas is excited, and portions of the first region R1 and the second region R2 exposed through the mask MSK are etched by the generated active species such as ions and/or radicals, as shown in FIG. 4. Further, in the process ST1, a carbon-containing deposit such as a deposit of fluorocarbon and/or hydrocarbon is formed on the wafer W from the first processing gas. The deposit is appropriately etched by active species of oxygen. Thus, the openings of the mask MSK can be suppressed from being clogged up with the deposit.

In the subsequent process ST2, plasma of a second processing gas is generated within the processing vessel 12. The second processing gas contains a hydrogen gas ($H_2$ gas), a hydrofluorocarbon gas and a nitrogen gas ($N_2$ gas). The hydrofluorocarbon gas of the second processing gas may be, by way of non-limiting example, a $CH_2F_2$ gas. Further, in the present exemplary embodiment, the second processing gas may further contain at least one of a nitrogen trifluoride gas ($NF_3$ gas), a carbonyl sulfide gas (COS gas), a boron trichloride gas ($BCl_3$ gas), and a hydrocarbon gas.

In the process ST2, the second processing gas is supplied into the processing vessel 12, and the pressure within the processing space S is set to a predetermined pressure by the gas exhaust device 50. Further, in the process ST2, the high frequency power from the first high frequency power supply 62 and the high frequency bias power from the second high frequency power supply 64 are applied to the lower electrode 16.

In the process ST2, the second processing gas is excited. The hydrofluorocarbon in the second processing gas is dissociated into fluorine, hydrogen, carbon, hydrocarbon, and the like. The fluorine generated by the dissociation of the hydrofluorocarbon combines with hydrogen generated by dissociation of the hydrogen gas. Accordingly, in the process ST2, the amount of fluorine contributing to the etching decreases. Furthermore, the carbon and/or the hydrocarbon generated by the dissociation of the hydrofluorocarbon adhere to a sidewall surface SW surrounding a space formed by the etching and to a surface MS of the mask MSK. As a result, a deposit DP is formed, as shown in FIG. 5. Accordingly, the sidewall surface SW is protected, and the width of the opening of the mask MSK can be controlled. Further, the amount of the carbon and/or the hydrocarbon adhering to the surface MS of the mask MSK is larger than the amount of the carbon and/or the hydrocarbon adhering to the sidewall surface SW. However, the carbon and/or the hydrocarbon adhering to the surface MS of the mask MSK may be reduced by active species of the nitrogen. Accordingly, the openings of the mask MSK can be suppressed from being clogged up.

Further, in case that the second processing gas contains the nitrogen trifluoride gas, fluorine generated by dissociation of the nitrogen trifluoride etches the first region R1 and the second region R2. Since, however, the amount of the fluorine is reduced as the fluorine combines with hydrogen, an etched amount of the first region R1 and the second region R2 in the process ST2 is smaller than that of the first region R1 and the second region R2 in the process ST1. Furthermore, nitrogen generated by the dissociation of the nitrogen trifluoride contributes to adjusting an etched amount of the mask MSK and an amount of the hydrocarbon deposited on the mask MSK.

In addition, in case that the second processing gas contains the carbonyl sulfide gas, a sulfur (S)-containing reaction product generated by dissociation of the carbonyl sulfide is deposited on the mask MSK to protect the mask MSK and contribute to adjusting the opening width of the mask MSK.

Furthermore, in case that the second processing gas contains the boron trichloride gas, a reaction product between silicon and fluorine, which is generated by dissociation of the boron trichloride, is deposited on the sidewall surface SW to protect the sidewall surface SW. Further, in case that the second processing gas contains the hydrocarbon gas, the hydrocarbon gas serves as a hydrocarbon source for protecting the sidewall surface SW.

In the method MT, after a sequence SQ including the process ST1 and the process ST2 is performed, it is determined in a process STJ whether a stop condition is satisfied. As for the stop condition, if the repetition number of the sequences SQ reaches a preset number, it is determined that the stop condition is satisfied. In the process STJ, if it is determined that the stop condition is not satisfied, the sequence SQ is performed again, starting from the process ST1. Meanwhile, in the process STJ, if it is determined that the stop condition is satisfied, the method MT is ended. As stated above, in the method MT, as the sequence SQ is performed multiple number of times, the first region R1 and the second region R2 are etched until the space reaches a surface of the base layer UL, as shown in FIG. 6.

As described above, in the method MT, the first region R1 and the second region R2 are etched in the process ST1, and the deposit DP is formed on the sidewall surface SW formed by the etching in the process ST2. That is, since the etching of the first region R1 and the second region R2 and the forming of the deposit DP configured to protect the sidewall surface SW are performed alternately, it is possible to suppress the sidewall surface SW to be etched in a horizontal direction (a direction orthogonal to a film thickness direction). Especially, the effect of protecting the sidewall surface SW by the deposit DP is exerted in the second region R2 which tends to be easily etched in the horizontal direction in the etching of the process ST1. Therefore, according to the method MT, the verticality of the sidewall surface SW formed by the etching can be improved.

Furthermore, in the method MT according to the exemplary embodiment, in the sequence SQ, a processing time period of the process ST1 may be set to be longer than a processing time period of the process ST2. The process ST1 is mainly performed to etch the first region R1 and the second region R2 as stated above. Meanwhile, the process ST2 is mainly performed to protect the sidewall surface SW as described above, and the contribution of the process ST2 to the etching is relatively small. Accordingly, by setting the processing time period of the process ST1 to be longer than the processing time period of the process ST2, the throughput of etching the first region R1 and the second region R2 can be improved.

The above-described exemplary embodiments are not limiting, and various modifications and changes can be made. For example, the method MT may be performed by any of various types of plasma processing apparatuses such as an inductively coupled plasma processing apparatus, a plasma processing apparatus using a surface wave such as a microwave, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A method of etching a first region and a second region of a processing target object at the same time, the first region including a multilayered film in which silicon oxide films and silicon nitride films are alternately stacked on top of each other, the second region including a silicon oxide film having a thickness larger than a thickness of the silicon oxide film of the first region, and the processing target object having a mask provided with openings on the first region and the second region, the method comprising:
    generating plasma of a first processing gas containing a fluorocarbon gas and a hydrofluorocarbon gas within a processing vessel of a plasma processing apparatus into which the processing target object is carried to etch the first region and the second region simultaneously; and
    generating plasma of a second processing gas containing a hydrogen gas, a hydrofluorocarbon gas and a nitrogen gas within the processing vessel of the plasma processing apparatus,
    wherein the generating of the plasma of the first processing gas and the generating of the plasma of the second processing gas are repeated alternately.

2. The method of claim 1,
    wherein a processing time period of the generating of the plasma of the first processing gas is longer than a processing time period of the generating of the plasma of the second processing gas.

3. The method of claim 1,
    wherein the second processing gas further contains a nitrogen trifluoride gas.

4. The method of claim 1,
    wherein the second processing gas further contains a carbonyl sulfide gas.

5. The method of claim 1,
    wherein the second processing gas further contains a boron trichloride gas.

6. The method of claim 1,
wherein the second processing gas further contains a hydrocarbon gas.

7. The method of claim 1,
wherein the mask is made of carbon.

8. The method of claim 1,
wherein the second region includes a first sub-region and a second sub-region, the first sub-region includes a plurality of the silicon nitride films extended from the first region in a direction orthogonal to a stacking direction of the multilayered film, the plurality of the silicon nitride films extended into the first sub-region from the first region are ended within the first sub-region to form a step shape, and the second sub-region consists of a single-layered silicon oxide film.

\* \* \* \* \*